United States Patent [19]

Spofford, Jr.

[11] 3,842,412

[45] Oct. 15, 1974

[54] HIGH RESOLUTION MONOLITHIC DIGITAL-TO-ANALOG CONVERTER

[75] Inventor: Walter R. Spofford, Jr., Bedford, Mass.

[73] Assignee: Analog Devices, Incorporated, Norwood, Mass.

[22] Filed: Nov. 22, 1972

[21] Appl. No.: 308,687

[52] U.S. Cl. ............................ 340/347 DA, 307/270

[51] Int. Cl. ............................................ H03k 13/04

[58] Field of Search....... 340/347 DA; 307/213, 270

[56] References Cited

UNITED STATES PATENTS

| | | | |
|---|---|---|---|
| 3,474,440 | 10/1969 | Schmid | 340/347 |
| 3,534,245 | 10/1970 | Limberg | 323/4 |
| 3,582,939 | 6/1971 | Campbell | 340/347 DA |
| 3,593,504 | 4/1971 | Breuer | 307/270 |
| 3,685,045 | 8/1972 | Pastoriza | 340/347 DA |
| 3,714,543 | 1/1973 | Sahara et al. | 323/4 |
| 3,747,088 | 12/1970 | Pastoriza | 340/347 DA |

OTHER PUBLICATIONS

Robert C. Dobkin (National Semiconductor) "IC Creates a Precise 1.2–Volt Reference," Sept. 18, 1972, pp. 87–90–91, Electronics Products Magazine.

*Primary Examiner*—Joseph F. Ruggiero
*Assistant Examiner*—Vincent J. Sunderdick
*Attorney, Agent, or Firm*—Bryan, Parmelee, Johnson & Bollinger

[57] ABSTRACT

A monolithic digital-to-analog converter capable of converting a 10-bit digital input signal to a corresponding analog signal, and comprising a series of transistor current sources selectively operable by corresponding transistor buffers. Multiple transistors are used in attenuator arrangements to provide proper binary weighting for certain of the current sources. The outputs of the current sources are regulated to correspond to a reference current produced by a source controlled by a temperature-compensated voltage based on the stable and repeatable properties of forward-biased silicon junctions. This voltage also controls a bipolar offset current source which subtracts from the output a current equal to one-half of full-scale output, to permit bipolar operation with offset-binary coding.

25 Claims, 4 Drawing Figures

PATENTED OCT 15 1974 3,842,412

PATENTED OCT 15 1974

3,842,412

SHEET 2 OF 2

HIGH RESOLUTION MONOLITHIC DIGITAL-TO-ANALOG CONVERTER

BACKGROUND OF THE INVENTION

1. Field of the Invention

This invention relates to digital-to-analog converters. More particularly, this invention relates to such converters provided on monolithic IC chips.

2. Description of the Prior Art

Digital-to-analog converters have been provided over the years in a number of different forms. Binary current switches were adopted early, and an excellent example of such a design, using discrete solid-state elements, is shown in U.S. Pat. No. 3,685,045. A subsequently developed arrangement presently used commercially in large quantities is the "quad-switch" module configuration disclosed in copending application Ser. No. 102,854 filed by James J. Pastoriza on Dec. 30, 1970.

More recently, it has become desirable to provide on a single IC chip digital-to-analog converters for 10 bits, or more. Such high-resolution converters present difficult design challenges, particularly with regard to achieving satisfactorily stable current output, and also with regard to the interconnection arrangements for such a relatively large number of switches on a single chip. Proposals have been made for solving certain of the problems inherent in such high-resolution IC converters, but the available designs have not been fully satisfactory.

SUMMARY OF THE INVENTION

The disclosed embodiment of the invention, to be described hereinbelow in detail, comprises a 10-bit digital-to-analog converter formed on a single chip together with special circuitry to regulate the switch currents by means of a precision temperature compensation arrangement. The current regulation system incorporates a reference current generator which is controlled by a reference voltage source coupled thereto by means arranged to minimize the effect of changes in base-to-emitter voltage of the reference current source. The reference voltage circuit is based on the stable and repeatable properties of forward-biased silicon junctions, and includes unique features including means to compensate for the non-linear variation with temperature of the base-to-emitter voltage in the reference current source transistor, and means to compensate for changes in base current of that transistor due to temperature variations. The converter also includes means controlled by the reference voltage source for producing a regulated bipolar offset current to permit the converter to operate with offset binary coding. Novel means are employed to attenuate the currents of certain of the switches to assure proper binary weighting of the individual current contributions.

Accordingly, it is a principal object of the present invention to provide superior digital-to-analog converter apparatus. A more specific object of the invention is to provide an improved high-resolution converter formed on a monolithic chip. A still further object of the invention is to provide a highly stable reference current generator for use in digital-to-analog converters and the like. Still other objects, aspects and advantages of the invention will be pointed out in, or apparent from, the following description considered together with the accompanying drawings.

DESCRIPTION OF THE PREFERRED EMBODIMENT

Figure 1A:
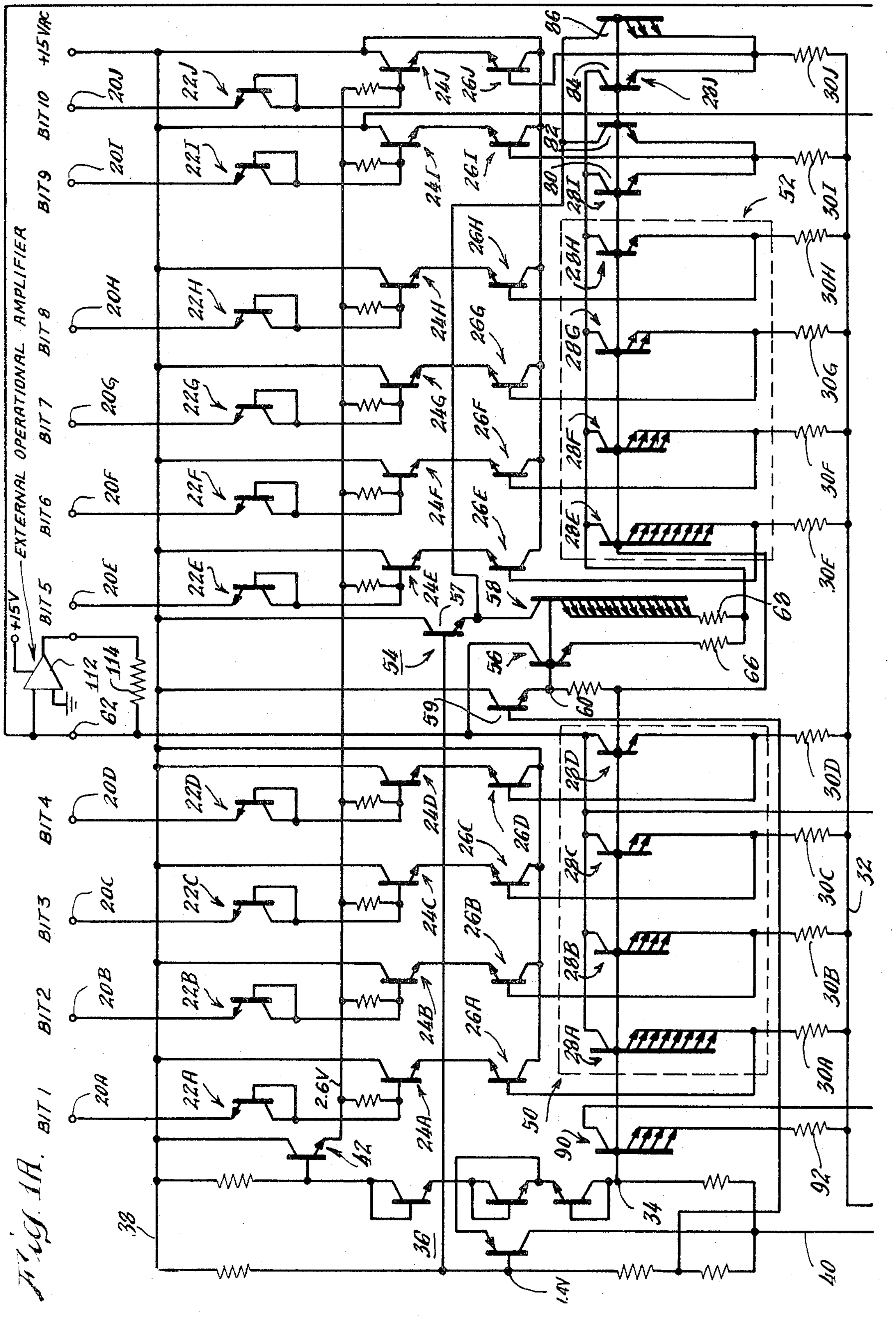
FIGS. 1A and 1B together present a schematic diagram showing the circuit of a 10-bit digital-to-analog converter formed on a single IC chip.

Referring now to FIG. 1A, there is shown a monolithic digital-to-analog converter including transistors and resistors formed on a single IC chip, e.g. 75 × 90 mils in size. This converter includes individual input terminals 20 (20A, etc.) to which are directed respective binary signals of an input digital number to be translated into an analog signal. The binary signals desirably are positive 0.8V-to-2.0V TTL (transistor-transistor-logic) transitions. The input signals pass through respective diodes 22 (22A, etc.) operating as current sources. The outputs of these current sources are directed through level translators in the form of Zener-type reverse-biased transistors 26 (26A, etc.) arranged to apply control signals at proper d-c level to the emitters of corresponding transistor switches 28 (28A, etc.) connected as current generators.

These switch transistors 28 have their emitters connected through respective resistors 30 (30A, etc.) to a common voltage line 32 having a potential of about −11.6 volts. (As will be explained hereinbelow, this potential is automatically controlled to ensure constant current flow through the transistors 28.) The bases of the switch transistors 28 are connected together to a fixed potential terminal 34 forming part of a voltage supply network generally indicated at 36, and connected between the +15V and −15V supply lines 38 and 40. This supply network also includes a transistor 42 the emitter of which develops a 2.6 volt clamp potential for the bases of the buffer current-source transistors 24.

The transistor switches 28 comprise two identical four-switch groups 50, 52, comparable functionally to the quad-switch modules disclosed in copending application Ser. No. 102,854, filed Dec. 30, 1970, by James J. Pastoriza. The four resistors 30 for each quad group are binarily weighted (10K, 20K, 40K, 80K) to produce correspondingly weighted current contributions from the respective current generators. Also as taught in that copending application, the areas of the emitters of the associated transistors are correspondingly proportioned (as indicated schematically) to ensure equal current densities and thereby equal base-to-emitter voltage drops in all eight of the transistors.

Since the two quad-switch groups 50, 52 of transistors are identical, with equal output currents, it is necessary to attenuate the composite current from the second group before summing it with the composite current of the first group. In the converter described in said copending application Ser. No. 102,854, such attenuation was effected by a resistance network arranged as a current divider. However, in accordance with one aspect of the present invention, this attenuation is effected in a unique manner by a transistor attenuator circuit generally indicated at 54.

The attenuator circuit 54 comprises two transistors 56, 58 the bases of which are connected together to a fixed potential point 60. The collector of one transistor 56 is connected to the converter output bus 62, as is the common collector output current line 64 for the first group 50 of transistor switch current generators 28. The collector of the other transistor 58 is returned through another transistor 57 directly to the +15V line, so that the converter output current at bus 62 is not affected by current flow through that second transistor. The base voltages of transistors 56, 58 are controlled by a transistor 59.

The emitters of the two transistors 56, 58 are connected through respective resistors 66, 68 to the common collector output current line 70 of the second group 52 of transistor-switch current generators 28. The ohmic resistances of these two resistors 66, 68 are proportioned to match the desired attenuation (16:1) of the current produced by the second switch group 52. For example, the resistors 66, 68 may be 24K ohms and 1.6K ohms respectively so that the left-hand transistor 56 carries 1/16th of the total current flowing through the two transistors, the remaining 15/16th flowing through the other transistor 58. The areas of the emitters of transistors 56, 58 are correspondingly proportioned, with transistor 56 having "one" emitter and the other transistor 58 having "fifteen" emitters, thus ensuring equal base-to-emitter voltage drops.

With the described arrangement, the composite analog current flowing in the second group output line 70 will be divided between the two transistors 56, 58 in accordance with the desired attenuation ratio. Thus only 1/16th of the current contributions from the second four-switch group 52 will reach the output bus 62, to be summed with the unattenuated composite current from the common output line 64 of the first four-switch group 50.

For a ten-bit converter (as disclosed), it is necessary to add to the eight switches already described, further transistor-switch current generators 28I, 28J. These current generators must supply currents which are respectively one-half and one-quarter the magnitude of the current from the 8th-bit switch 28H. Thus, if the same switch design were used for the 9th and 10th switches, the emitter resistors would have to be 160K, and 320K, respectively, too large for a commercially satisfactory converter. To avoid that problem, a novel switch design is used, as will now be described.

The two switches 28I, 28J of this new design comprise pairs of transistors 80, 82; 84, 86, with the bases and emitters of each pair connected together. The collector of one transistor 80, 84 of each pair is connected to the common current line 70, and the other two collectors are connected directly to the emitter of transistor 57. The common emitters of each pair are connected to the voltage line 32 through respective resistors 30I, 30J each of 80K ohms, i.e. identical to the emitter resistor 30H in the 8th-bit switch 28H. Thus the total current through each transistor pair 80, 82; 84, 86 will be equal to the current flowing through the 8th bit switch (1/16 MA). this in switches 28I and 28J, teis current will be divided between the two transistors of each pair, with the current of only one transistor of each pair flowing in the common line 70 to the output bus 62.

The ratio of current division between the transistors of the two pairs 80, 82; 84, 86 is determined by the ratio of areas of the emitters of each transistor pair. The emitters of transistors 80, 82 are of equal area, so that the current flowing through transistor 80 will be one-half of the total (i.e. 1/32 MA). The areas of the emitters of the other pair are in a ratio of 1:3, so that the current flowing through transistor 84 will be one-fourth of the total (i.e. 1/64 MA). Accordingly, it will be seen that the currents contributed by switches 28I and 28J are properly weighted for the 9th and 10th bits of a 10-bit converter, without requiring the use of excessively large emitter resistors.

TEMPERATURE COMPENSATION

To ensure that the currents produced by the transistor switches 28 are held at substantially constant levels, the converter disclosed herein employs the basic "reference transistor" technique described in U.S. Pat. No. 3,685,045. Thus the IC chip is formed with an additional transistor-switch 90 serving as a reference current source. The base of this transistor is connected to the common base line of the other switches 28, and its emitter is connected through a resistor 92 to the common voltage line 32. This resistor 92 matches the emitter resistor 30B (20K) of the 2nd-bit switch 28B. Correspondingly, transistor 90 is formed with "four" emitters, to provide the same current density as the other switches in the converter.

Figures 1B, 2, 3:
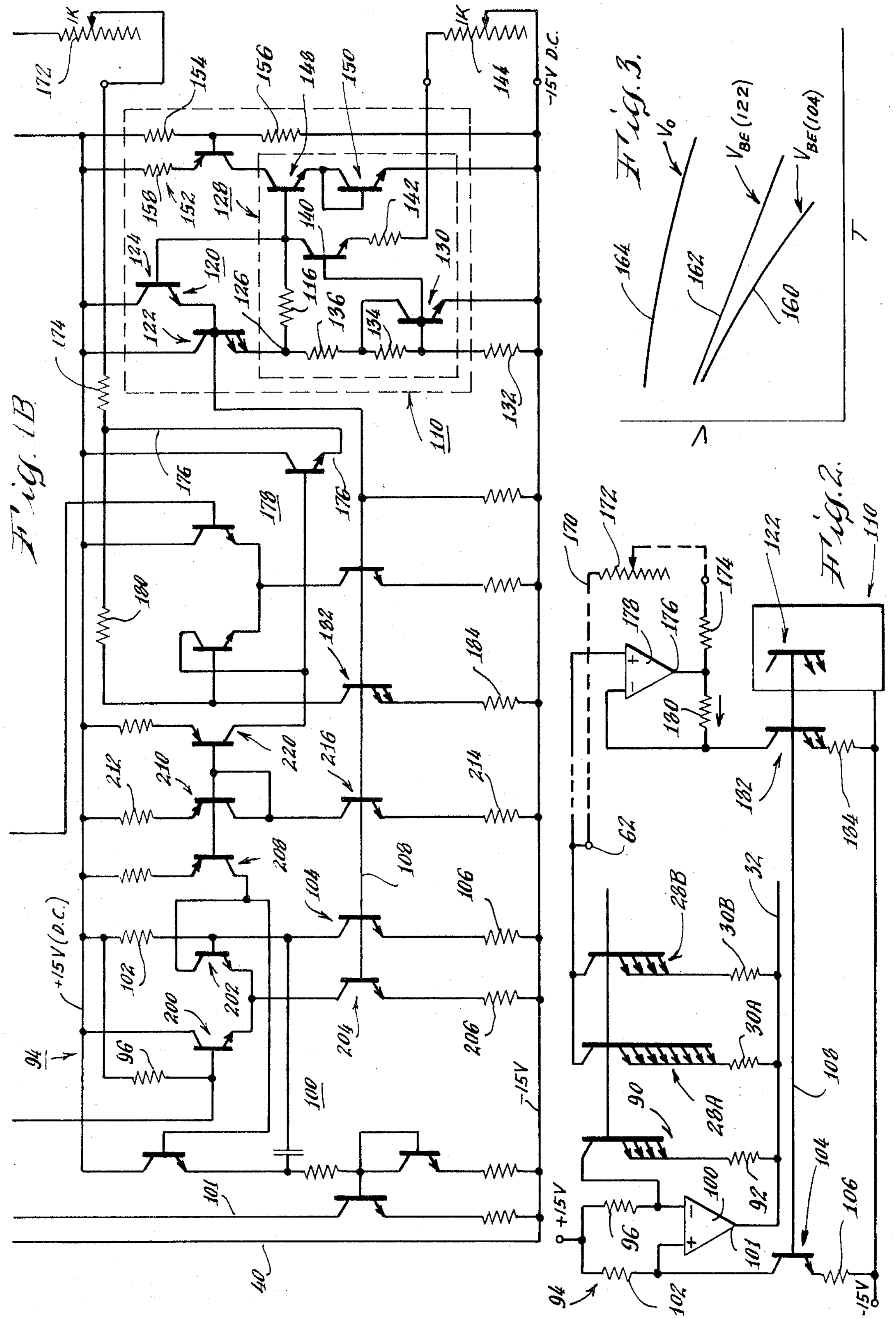
FIG. 2 is a block diagram presenting certain elements of the circuitry of the converter of FIGS. 1A and 1B.
FIG. 3 is a graph showing pertinent voltage variables with respect to temperature, to aid in explaining the operation of portions of the temperature-compensating circuitry.

The collector of transistor 90 is connected to a current-comparison circuit generally indicated at 94 in FIG. 1B. Referring also to FIG. 2, which shows elements of the FIG. 1B circuit in block diagram format, this collector is connected through a resistor 96 (40K) to the +15V line, and to the inverting input terminal of an operational amplifier generally indicated at 100. The non-inverting input terminal is connected through another resistor 102 (40K) to the +15V line, and through a transistor reference current source 104 (sometimes referred to herein as the output transistor) and a resistor 106 (9.64K) to the −15V line. The transistor base is connected to a common base line 108 the voltage of which is precisely regulated by a voltage control source 110 functioning (in a manner to be described hereinbelow in detail) to hold the voltage across resistor 106 substantially constant. Thus there is a substantially constant current flow in the emitter, and in the collector, of transistor 104, and a correspondingly constant current flow through resistor 102.

The output 101 of the operational amplifier 100 controls the voltage of the common emitter supply line 32, and thereby controls the amount of current flow through the switches 28 and reference transistor 90. With a constant flow of reference current through resistor 102 in the input of amplifier 100, and with the resistor 102 equal to resistor 96, the amplifier will adjust the voltage of line 32 to such a value that the current through resistor 96 will equal the reference current (in this case ¼ MA). That is, the feedback action of the operational amplifier automatically compensates for any change in the base-to-emitter voltage of the reference and switch transistors (all of which track very closely), and also compensates for any changes in "$\beta$" of the transistors.

Thus any output current error would be reduced to that caused by changes in resistance of the output resistor 106. If such resistance changes do occur, that normally would not create any problem because the output current at bus 62 (FIG. 1A) typically is converted to an output voltage by an external operational amplifier 112 and a feedback resistor 114. This is an internal resistor, i.e. it is part of the monolithic chip, so that its resistance tracks the resistance of the emitter resistor 106 very closely. Thus there will be no significant changes in output voltage due to changes in resistance of output resistor 106.

In order to ensure a constant reference current through resistor 102, the voltage control source 110 must be provided with special characteristics. Turning now to details of that voltage source, and referring to FIG. 1B, the voltage control source includes a current supply 120 comprising a transistor 122 the base of which is connected to the common base line 108 and to the emitter of a transistor 124 which furnishes base current to the line 108. The emitter of transistor 122 supplies current to an output terminal 126 of a reference voltage circuit generally indicated at 128.

As will be explained in detail hereinbelow, this reference voltage circuit 128 produces a closely regulated voltage $v_o$ at the output terminal 126. This regulated voltage serves, through the connection established by transistor 122 and the common base line 108, to correspondingly regulate the voltage across the output emitter resistor 106. More particularly, the potential of line 108 will always be higher than that of terminal 126 by an amount exactly equal to the base-to-emitter voltage of transistor 122, and the emitter voltage of transistor 104 (and thus the voltage across resistor 106) will always be lower than the potential of line 108 by an amount exactly equal to the base-to-emitter voltage of transistor 104. Because transistors 104 and 122 are on the same IC chip, and because they are arranged to have the same base-to-emitter current density, their base-to-emitter voltages will be similarly characterized, i.e. the voltage on resistor 106 will track the regulated voltage on output terminal 126, thus tending to hold the reference current from transistor 104 constant.

In certain respects, the reference voltage circuit 128 is related to the voltage supply circuit described in an article by R. C. Dobkin, appearing at page 87 in the Sept. 18, 1972, issue of Electronics Products Magazine. Referring to the simplified diagram shown in that article, the circuit comprises first transistor means including a first transistor $Q_1$ (in a diode-connected configuration) and a second transistor $Q_2$ both interconnected with circuit means to produce through the second transistor to current proportional to the difference between the base-to-emitter voltages ($\Delta V_{BE}$) of the two transistors. A resistor ($R_2$) is connected to the voltage output terminal and is arranged to conduct the current of the second transistor ($Q_2$) to develop at the output terminal a reference voltage component proportional to the difference in base-to-emitter voltages of the two transistors, to introduce a positive temperature coeefficient. The circuit further includes a third transistor connected to the resistor ($R_2$) to add to the reference voltage a component proportional to the base-to-emitter voltage of the third transistor, to introduce a negative temperature coefficient. By setting the output voltage at the energy-band-gap voltage (referred to as $V_{go}$ and having a value of 1.205 volts), and by supplying the transistors from a current source the current of which varies linearly with temperature, it turns out that the output voltage (1.205 volts) theoretically will be relatively immune to changes in temperature. A circuit with such a characteristic of course would be highly desirable as a building block in producing a reference current source as described herein.

However, it has been found that certain significant changes should be made to the circuit described in the above-identified article in order to achieve the desired performance characteristics. First, it has been found that stability can be enhanced by using as the reference voltage level an integral multiple of the energy-band-gap voltage; in the present case 2.410 ($2 \cdot V_{go}$) was selected for the voltage $V_o$ at output terminal 126. To achieve the desired $\Delta V_{BE}$ effect with this higher voltage, the voltage source employs transistor means which, although incorporating only a single transistor 130, provides the effect of multiple diode-connected transistors in series, permitting the transistor collector to be biased in the linear region, and avoiding the use of actual diode-connected transistors which introduce difficulties in performance. To achieve this simulated multiple-diode circuit, a pair of series resistors 132, 134 are used to interconnect the collector, base and emitter of the transistor, and a third series resistor 136 connects this combination to the output terminal 126.

With a transistor circuit simulating the effects of more than one diode drop, the series resistors 132–136 must be selected to provide that the open-circuit collector voltage of the transistor (i.e. the voltage which would be measured at the junction of resistors 134, 136 if the transistor is removed) should be the same multiple of the energy-band-gap voltage ($Vgo$) as there are simulated diode drops. (The number of simulated diode drops is equal to the sum of the resistances of the bottom and middle resistors 132, 134, divided by the resistance of the bottom resistor.) If exactly two diodes were simulated, then the open-circuit voltage should be $2 \cdot Vgo$. Since such an ideal cannot be achieved with the series-resistor diode simulation, the series resistor values must be arranged to provide correspondence between the actual open-circuit voltage (which will be something less than $2 \cdot Vgo$) and the (non-integral) number of simulated diodes. Calculations have shown that, to achieve this result, the middle resistor 13 should be nine-tenths of, and the top resistor 136 one-tenth of, the value of the bottom resistor 132. In an actual embodiment, these resistances were respectively, from the top, 2.53K, 23.8K, and 26.4K. By so arranging the circuitry, the equivalent base-to-emitter voltage of the transistor 130 varies substantially linearly with temperature, thus providing the desired characteristic to achieve voltage compensation at the output terminal 126.

The base of transistor 130 is connected to the base of a second transistor 140 the emitter of which is connected through a resistor 142 (and a gain-adjust variable resistor 144) to the −15V line. The current through this second transistor is proportional to the difference between the base-to-emitter voltages of the two transistors 130, 140 and varies linearly with temperature, with a positive temperature coefficient. A resistor 146 is connected between the collector of transistor 140 and the output terminal 126 to develop at that terminal a reference voltage component corresponding to the current through transistor 140, and thus having a positive temperature coefficient.

The collector of transistor 140 also is connected to a pair of series-connected transistors 148, 150 which add to the output terminal 126 a voltage component proportional to the base-to-emitter voltage of transistor 148. This component has a negative temperature coefficient, and is linearly related (or very nearly so, as will be explained) to temperature because transistors 148, 150 are supplied with current from a current source 152 utilizing a circuit configuration furnishing a current which varies nearly linearly with changes in temperature. The circuit parameters are so selected that the temperature-induced changes in voltage across resistor 116 are counteracted by opposite-polarity temperature-induced changes in base-to-emitter voltage of transistor 148, providing a regulated voltage of 2.410 volts at the output terminal 126.

A further problem is providing constant-current through the output transistor 104 is that, with constant current flow, the base-to-emitter voltage of that transistor necessarily will vary slightly non-linearly with respect to temperature. Since the current through transistor 122 varies linearly with temperature (as required by the votlage-compensating circuitry comprising transistors 130 and 140), its base-to-emitter voltage will vary linearly with respect to temperature. Thus, since the base-to-emitter voltages of transistors 104 and 122 do not precisely track, a constant voltage at the emitter of transistor 122 does not result in an exactly corresponding constant voltage at the emitter of transistor 104.

To overcome this problem, the current source transistor 152 is operated at a voltage which causes its output current to vary slightly non-linearly with respect to temperature. Specifically, series resistors 154, 156 are so proportioned that the transistor base is held at 1.45V below the +15V line. (Note: if the base of this transistor were held at exactly $V_{go}$ — or 1.205 volts — below the potential of the remote end of the emitter resistor 158, i.e. below the +15V line, then the emitter current would vary linearly with changes in temperature, in known fashion.) The effect of this purposeful non-linear current vs. temperature variation through transistors 148, 152 is to produce a correspondingly non-linear base-to-emitter voltage variation, thereby to introduce this same non-linearity into the voltage at output terminal 126.

The graph curves of FIG. 3 have been included to illustrate this principle (although it should be noted that these curves do not represent actual values nor actual relative amounts of change). Curve 160 represents the variation in base-to-emitter voltage of the output transistor 104 with respect to temperature, showing its non-linear characteristic which is due to the fact that its current is constant. Curve 162 shows the thermally linear base-to-emitter voltage of transistor 122, corresponding to the fact that its current varies linearly with temperature. Curve 164 shows the purposely induced non-linearity of the reference voltage $V_o$ at output terminal 126, whereby the non-linear changes in $V_o$ tend to combine with the linear changes in $V_{BE}$ of transistor 122 to match the non-linear changes in $V_{BE}$ of transistor 104. Thus, the emitter voltage of the latter transistor is maintained substantially independent of changes in its $V_{BE}$.

Although the arrangement described provides for constant emitter current from output transistor 104, the collector current (which is actually the reference current desired to be held constant) can tend to vary a small amount due to changes in base current with temperature. To avoid that result, the reference voltage $V_o$ at output terminal 126 also is caused to vary slightly with temperature to exactly compensate for changes in base current.

This compensation arrangement is based on the concept that (1) the voltage across resistor 116 includes a small component due to the flow of base current into transistor 148, and (2) that this base current will vary with temperature proportionately the same amount as the base current into the output transistor 104. The base current for the output transistor is equal to its collector current (¼ MA) divided by the transistor "$\beta$", while the base current for the transistor 122 is equal to its collector current (about 100 $\mu$A) divided by "$\beta$". In an IC chip, "$\beta$" can be assumed to be the same for both transistors, and to have the same temperature coefficient.

To ensure that the change in base current through the output transistor 104 has no effect on its collector current, its emitter voltage is automatically altered slightly to accommodate any change in base current flow through the emitter resistor 106 (i.e. so as to make up for any loss or gain of base current), thereby preventing a corresponding change in collector current which otherwise would occur to make up for that change in base current. The alteration in emitter voltage is effected by causing the voltage $V_o$ at terminal 126 to change slightly, as a result of the temperature-induced change in base current through transistor 148. The magnitude of voltage change is determined by the ohmic resistance of resistor 116. It works out that this resistance should be proportionately related to the resistance of emitter resistor 104 in the ratio of the base currents for the two transistors. Since "$\beta$" is the same for both transistors, the ratio of base currents is equal to the ratio of collector currents, and in the present embodiment that ratio is 250/100, or 2.5. Thus resistor 146 should be 2.5 times larger than the emitter resistor 104 (9.64K), so resistor 116 should be 24.1K to provide correct base current compensation.

BIPOLAR OPERATION

For some applications, it is desired to operate the converter in a bipolar mode, and for that purpose provision is made to inject into the output bus 62 (FIG. 1A) a regulated bipolar offset current equal to one-half of full-scale output current. This current is supplied through a lead 170 which can be connected through an external 1K variable resistor 172 (FIG. 1B) and an internal fixed resistor 174 (19.5K) to the output 176 (see also FIG. 2) of an operational amplifier 178. The non-inverting input of the amplifier is returned to the output bus. The inverting input is connected through a resistor 180 (20K) to the amplifier output 176, and also is connected to the collector of a current-source transistor 182.

This bipolar current source transistor 182 is exactly comparable to the reference current source 104 previously described, except that it is arranged with its emitter resistor 184 to produce ½ MA instead of ¼ MA, and thus has two emitters instead of one. The emitter current densities of transistors 104, 122 and 182 are equal, to provide close tracking of characteristics. Transistor 182 operates to ensure that the current through resistor 180 is held precisely at ½ MA. Resistor 180 is equal to the sum of resistors 172 and 174 (when the former is at mid-setting), and with the two resistors equal, the amplifier 178 will drive a current of ½ MA through resistors 172 and 174 to the output bus 62.

The converter design disclosed in FIGS. 1A and 1B includes a number of circuit aspects which will be mentioned only briefly since they are not essential to an understanding of the principles and concepts of the present invention. In more detail, it will be seen that the operational amplifier 100 comprises a differential pair of transistors 200, 202, the emitters of which are connected through a transistor 204 and resistor 206 to the −15V line. The base of transistor 204 is connected to the common base line 108. Transistor 202 is connected to a conventional "active load" transistor 208 arranged to ensure that the current from transistor 204 is evenly divided between transistors 200, 202. To this end, the base of transistor 208 is connected to the base of a diode-connected transistor 210 forming part of a voltage-dividing transistor 216 the base of which is connected to the common base line 108. Transistor 210 also operates a second active load 220 which controls one of the balanced differential pair of transistors forming part of operational amplifier 178 as in amplifier 100.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

I claim:

1. In an IC digital-to-analog converter, wherein a plurality of individual switchable current generators are connected to a common current supply terminal to furnish weighted current contributions thereto when selectively activated by a digital input signal, each of said current generators having a control terminal to which a switch signal is supplied to activate the associated current generator;

the improvement for providing a current generator which develops a very small current without requiring the use of an excessively large resistor, comprising:

first and second transistors;

means connecting the bases of said transistors together;

means connecting the emitters of said transistors together;

a resistor connected between said emitters and a supply voltage line to produce a flow of current through both of said transistors and said resistor when the two transistors are switched on;

switch means responsive to one bit of a digital input signal and including means to activate both of said transistors together; and means connecting the output of said first transistor to said current supply terminal to furnish thereto a fractional portion of the total current flowing through both of said transistors.

2. Apparatus as in claim 1, wherein the areas of said emitters are equal, whereby the total current divides equally between the two transistors.

3. Apparatus as in claim 1, wherein the areas of said emitters are proportioned in an integral multiple relationship.

4. Apparatus as in claim 3, wherein the area of the emitter of said second transistor is three times the area of the emitter of said first transistor.

5. A digital-to-analog converter having a reference current source the output current of which is maintained substantially independent of changes in temperature, said reference current source comprising:

first transistor means comprising at least two transistors;

a current generator having an output terminal connected to said first transistor means to produce current flow through said two transistors;

first circuit means interconnected with said first transistor means and said current generator to produce through the second of said transistors a current proportional to the difference in the base-to-emitter voltages of said two transistors;

a first resistor connected between said second transistor and said current generator output terminal to conduct the current passing through said second transistor and to produce at said generator output terminal a reference voltage having a first component proportional to the difference in base-to-emitter voltages of said two transistors;

a third transistor;

means supplying current flow through said third transistor;

second circuit means interconnecting said first resistor and said third transistor to add to said reference voltage a second component proportional to the base-to-emitter voltage of said third transistor, the thermally-produced changes in said first and second components being in opposite direction whereby said reference voltage is compensated for temperature changes;

the further improvement wherein said current generator comprises a fourth transistor having its emitter connected to said output terminal;

a reference current output transistor;

supply voltage means;

an output resistor connected between the emitter of said output transistor and said supply voltage means to set the level of current flow through said output transistor;

means connecting the base of said output transistor to the base of said fourth transistor, whereby the regulated voltage at the emitter of said third transistor produces a correspondingly regulated voltage at the emitter of said output transistor and a correspondingly regulated output current through said output resistor; and a current load connected in series with said output transistor and said supply voltage to receive said regulated output current.

6. Apparatus as claimed in claim 5 wherein said load is connected to the collector of said output transistor.

7. Apparatus as claimed in claim 6, wherein said load comprises a regulating circuit arranged to produce constant current output from the converter.

8. Apparatus as claimed in claim 6, wherein said load comprises means to produce a bipolar offset current in the output of the converter.

9. A reference current source for use in digital-to-analog converters and the like comprising:

an output transistor;

an output resistor connected between the emitter of said output transistor and a supply line, to fix the magnitude of current flow through that transistor in proportion to the voltage between the supply line and the transistor base;

an output circuit connected to the collector of said output transistor to supply to a load the current flowing through said output transistor and resistor;

a second transistor the emitter of which serves as a reference voltage terminal;

said output transistor and said second transistor being arranged to provide equal current densities therein;

means connecting the bases of said two transistors together, whereby the base voltage of said output transistor will track the base voltage of said second transistor;

a reference voltage circuit connected to the emitter of said second transistor to receive current therefrom and to develop at that emitter a reference voltage closely corresponding to the voltage to be developed at the emitter of said output transistor;

said reference voltage circuit including transistor means and resistor means interconnected between said second transistor emitter and said supply line and arranged to cooperate in regulating said reference voltage with respect to changes in temperature to provide substantially constant current through said load.

10. Apparatus as claimed in claim 9, wherein said transistor means comprises at least one transistor connected to simulate more than one diode and to develop a voltage corresponding to the base-to-emitter voltage of such diodes, said reference voltage being set at a value equal to an integral multiple of 1.205 volts.

11. Apparatus as claimed in claim 10, including a voltage-dividing network having first, second and third series-connected resistors;

the emitter of said one transistor being connected to the remote end of said third resistor;

the base of said one transistor being connected to the junction between said second and third transistors;

the collector of said one transistor being connected to the junction between said first and second resistors;

the remote ends of said first and third resistors being connected to said voltage terminal and a power supply line respectively.

12. Apparatus as claimed in claim 11, wherein said series-connected resistors are in the ratio of 1:9:10; and said reference voltage is set at 2.410 volts.

13. Apparatus as claimed in claim 9, wherein said transistor means includes means to produce a non-linear variation with temperature in the value of said reference voltage, to compensate for the non-linear variation in base-to-emitter voltage of said output resistor.

14. Apparatus as claimed in claim 13, wherein said transistor means includes one transistor with its base connected to said voltage terminal to produce at said terminal a voltage component corresponding to the base-to-emitter voltage of said one transistor; and current-generator means arranged to flow through said one transistor a current which varies non-linearly with respect to temperature, whereby the base-to-emitter voltage of said one transistor will vary non-linearly to develop the required compensation.

15. Apparatus as claimed in claim 14, wherein said current-generator means comprises a supply transistor having an emitter resistor connected in series with its emitter; and voltage means to maintain the voltage between the base of said supply transistor and the remote end of said emitter resistor at a value slightly different from 1.205 volts.

16. Apparatus as claimed in claim 15, wherein said voltage means fixes said voltage at about 1.45 volts, to provide the desired non-linearity of current with temperature.

17. Apparatus as claimed in claim 9, wherein said transistor means includes one transistor;

current-generator means supplying a flow of current through said one transistor to develop a base-to-emitter voltage therein;

a base resistor connected between the base of said one transistor and said voltage terminal;

the ohmic resistances of said base resistor and said output resistor being proportioned to provide, in response to a change in temperature, a change in voltage across said base resistor, due to the change in base current of said one transistor, equal to the change in voltage across said output resistor that would be caused by the change in base current in said output transistor, whereby to provide for constant collector current in said output transistor in the face of changes in base current thereof.

18. Apparatus as claimed in claim 17, wherein said ohmic resistances are proportioned in the ratio of the collector currents of said output transistor and said one transistor.

19. For use in a digital-to-analog converter and the like, a reference voltage circuit comprising:

transistor means including first and second transistors for developing a first voltage component proportioned to the difference in base-to-emitter voltages thereof, and a third transistor developing a second voltage component proportional to the base-to-emitter voltage thereof to be combined at an output terminal with said first component to provide a thermally-compensated composite reference voltage;

means to set said reference voltage at an integral multiple of 1.205 volts with respect to a power supply ground point;

said integral multiple being greater than one;

circuit means connecting said first transistor between said output terminal and said power supply ground point;

said circuit means including means to simulate the equivalent effect of more than one diode-connected transistor.

20. Apparatus as claimed in claim 19, wherein said circuit means comprises first, second and third resistors series-connected between said terminal and said ground point;

the emitter of said first transistor being connected to said ground point;

the base of said first transistor being connected to the junction between said second and third resistors; and the collector of said first transistor being connected to the junction of said first and second transistors.

21. Apparatus as claimed in claim 20, wherein the ohmic resistors of said series-connected resistors are in the ratio of 1:9:10.

22. A regulated reference current source comprising:

first circuit means having an input terminal arranged to receive an input current to produce at said input terminal a reference voltage;

said first circuit means including temperature-compensating circuit means operable to alter selected parameters of said first circuit means to regulate said reference voltage so as to maintain its magnitude at least approximately constant with changes in temperature;

a current generator comprising a first transistor with its emitter connected to said input terminal to supply said input thereto;

a reference current output transistor with its emitter connected to a resistor to form a current generator producing an output current proportional to the base voltage;

said first transistor and said output transistor being arranged to provide equal current densities therein;

means connecting the bases of said first transistor and said output transistor together, whereby the emitter voltage of said output transistor tracks said regulated voltage at the emitter of said first transistor and thereby regulates said output current; and an output circuit connected between the collector of said output transistor and the remote end of said resistor, to supply regulated current to a load.

23. A digital to-analog converter comprising a group of current sources arranged to be selectively activated in a pattern corresponding to a digital input;

means to sum the current contributions of said current sources to produce an analog output signal;

regulating means operable to control the magnitude of currents produced by said current sources, said regulating means including means to compare a current proportional to the currents of said sources with a reference current and to automatically adjust a parameter of said current sources to cause the currents produced thereby to conform to said reference current;

a source of reference current for said regulating means, said source of reference current having a control terminal to which a control voltage is supplied to regulate the magnitude of said reference current and maintain it substantially constant;

a source of bipolar offset current for said converter to supply to the output thereof a current which is a fractional portion of the full-scale output current of said converter, said source of bipolar offset current having a control terminal to which a control voltage is supplied to regulate the magnitude of said offset current and maintain it substantially constant; and a voltage control source having its output voltage connected to said control terminals of said source of reference current and said source of offset current, said voltage control source including means for adjusting said output voltage to maintain said reference current and said offset current at substsantially constant magnitudes, thereby to assure precise tracking between the offset output current and the converter output current produced by said group of current sources.

24. An integrated-circuit monolithic digital-to-analog converter comprising:

a first group of switch transistors each having emitter, base and collector electrodes;

a first set of resistors for said first group of switch transistors respectively, each such resistor being connected in the emitter circuit of the corresponding switch transistor to set the level of current therethrough;

said first set of resistors having ohmic resistances related in accordance with a binary pattern to binarily weight the individual switch currents correspondingly;

the emitter areas of said switch transistors being proportioned to the magnitude of current flowing through the respective transistor;

means connecting the bases of all of said switch transistors together;

a second group of switch transistors identical to said first group of switch transistors;

a second set of resistors identical to said first set of resistors and interconnected with said second group of switch transistors in the same manner as said first set of resistors is interconnected with said first group of switch transistors;

means connecting together the bases of all of said second group of switch transistors;

power supply means coupled to said bases to set the potentials thereof at predetermined controlled levels with respect to the emitter resistors;

first and second current-divider transistors each having emitter, base and collector electrodes;

means connecting the bases of said current-divider transistors together;

first and second resistors each connected at one end to the emitter of a respective one of said current-divider transistors;

means connecting said first and second resistors together at the other ends thereof;

said first and second resistors having ohmic resistances proportioned in a ratio corresponding binarily to the number of switch transistors in said first group of transistors, whereby to provide that the current-divider transistors separately conduct current according to that ratio;

the areas of the emitters of said two current-divider transistors also being proportioned in accordance with said ratio, to provide for equal current densities in said two current-divider transistors;

a current-summing terminal;

means coupling the collectors of all of said first group of switch transistors to said current summing terminal;

means coupling the common connection of said first and second resistors to the collectors of all of said second group of switch transistors;

means coupling the collector of one of said current-dividing transistors to said current-summing terminal to deliver thereto a predetermined fraction of the collector currents of all of said second group of switch transistors, in accordance with said ratio; and means coupling the collector of the other of said current-dividing transistors to said power supply means, to provide for current flow through said other current-divider transistor without the current flowing into said current summing terminal.

25. Apparatus as in claim 24, including means coupling said power supply means to the bases of said two current-dividing transistors and comprising impedance means to establish the base voltages thereof at a level offset with respect to the base voltage of said second group of switch transistors; and means connecting together all of the bases of said first and second groups of switch transistors.

* * * * *